THERMOELEMENT MADE BY PLASMA SPRAYING

Filed Oct. 6, 1966 2 Sheets-Sheet 1

INVENTORS
COURTLAND M. HENDERSON
RICHARD J. JANOWIECKI
BY Mary B. Moshier
ATTORNEY

THERMOELEMENT MADE BY PLASMA SPRAYING

Filed Oct. 6, 1966 2 Sheets-Sheet 2

INVENTORS
COURTLAND M. HENDERSON
RICHARD J. JANOWIECKI
BY Mary B. Moshier
ATTORNEY United States Patent Office 3,485,680

Patented Dec. 23, 1969

3,485,680

THERMOELEMENT MADE BY PLASMA SPRAYING

Courtland M. Henderson, Xenia, and Richard J. Janowiecki, Dayton, Ohio, assignors to Monsanto Research Corporation, St. Louis, Mo., a corporation of Delaware Continuation-in-part of application Ser. No. 451,875, Apr. 29, 1965. This application Oct. 6, 1966, Ser. No. 584,838

Int. Cl. H01v *1/32;* C23c *7/00;* B32b *15/04*

U.S. Cl. 136—208 4 Claims

ABSTRACT OF THE DISCLOSURE

Thermoelements made by arc plasma spraying a thermoelectric composition upon the outer surface of a refractory material and thermoelectric devices using a plurality of such elements.

Figure 1:
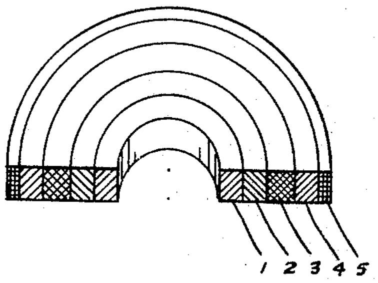

This is a continuation-in-part of our application Ser. No. 451,875, filed Apr. 29, 1965, now abandoned.

This invention relates to power generating devices and the like and more particularly relates to means of converting thermal energy into electrical energy in thermoelectric generators and cooling devices. More specifically, the invention provides new and valuable thermoelements and thermoelectric devices.

In accordance with the Seebeck effect, electromotive force is produced when one thermoelectric element is joined to a dissimilar thermoelectric element to form a circuit and their two junctions are maintained at different temperatures. This effect is utilized in thermoelectric generators, whereby electric power is generated when heat is applied at one junction and rejected at the other.

For environmental heating or cooling, rather than generation of electricity, there is utilized the Peltier effect wherein the above described circuit of dissimilar thermoelectric materials is also used. However, instead of applying heat at one junction and rejecting it at another, an electrical current is passed through the circuit causing heating or cooling at one junction and cooling or heating at another. A transfer of heat from the ambient environment and through the device is thus effected, resulting in heating or refrigeration.

In thermoelectric generators and other devices which are dependent on either the Seebeck effect or the Peltier effect, one junction must be maintained at a temperature which is higher than that of another; hence, the two junctions are commonly referred to as either the hot junction or the cold junction. Whether the device be based on the Seebeck or Peltier effect, its efficacy depends not only upon the nature of the thermoelectric material which is employed, but also upon the temperature difference of the two junctions. The greater such difference, the greater is the efficiency of either the electrical power generation or heating and cooling device, irrespective of the composition of the thermoelements. Of importance, also, in arriving at optimum thermoelectric efficiency is the geometry, i.e., the shape of the thermoelectric legs which are used in the thermoelectric couples from which the electricity generating and refrigerating devices are constructed.

Usually, thermoelectric legs have been made by hot pressing the powered thermoelectric into the desired shape. As is well-known, compacting by hot pressing usually does not permit the fabrication of long, thin objects. However, for many applications, high voltage-low power devices are sought. In such devices, legs having a high length-to-area ratio give the best performance. Also, as is well-known in the art, legs made of segments of different thermoelectric materials have been advocated in order to obtain a high temperature difference between the hot and cold junction. The figure of merit of some thermoelectric materials is a function of the temperature to which it is subjected. In segmented legs, each material is positioned in the leg at that portion where the temperature to which it will be subjected in operation will be that at which the figure of merit of the thermoelectric material is the highest. The relationship of figure of merit to operating temperature is readily determined for each thermoelectric material by routine testing. To provide an element suitable for operation at, say, 1200° C., a material should be used in proximity to the heat source which has a high figure of merit at about that temperature. At a more remote distance from the heat source, there may be used a material which deteriorates at 1200° C., but which is stable and has a high figure of merit at 800° C. to 600° C. At an even more remote distance, another material which is stable at and has a high figure of merit at lower temperature, say, at 600° C. to 400° C., may make up a third segment of the thermoelement. The resulting element will thus consist of segments of three diverse thermoelectric materials positioned to give along the element a gradient in the temperature-to-figure-of-merit ratio of said materials.

The fabrication of efficient segmented elements has presented many obstacles. Thermoelectric materials generally comprise a matrix of a semi-conducting element, alloy, or compound containing one or more dopants to give "n" or "p" thermoelectric property. When it is attempted to densify by hot- or cold-pressing of layers of the diverse materials in powedered form, the pressure and/or the heat required for compacting one of the materials may necessarily be so high that it causes the low temperature thermoelectric materials to melt and diffuse into the high temperature ones. Hence the desired optimization of performance is not attained. Like phenomena occur when previously molded or compacted solid pieces are hot-pressed. In order for proper bonding or joining to occur, one of the pieces must soften at the interface. This may result not only in diffusion of the one thermoelectric into another, but also may often bring about a chemical reaction between components of the element to give a substance at the junction which has changed properties, e.g., a higher electrical resistivity than that of the originally employed thermoelectrics. Also, in many instances, the joint may be mechanically inadequate and/or show poor resistance to thermal shock.

Historically, semiconductors and thermoelectric materials have been fabricated by rather sophisticated and expensive processes such as growth from melts, zone refining, cold-pressing and sintering, extrusion, hot-pressing via refractory dies, and isostatic hot-pressing.

Although these production methods have been refined, the processes pose inherent restrictions on the ultimate application and performance of devices using such materials. By nature, such processes are generally characterized by low production rates. Purity and microstructure (grain size and orientation—important to the attainment and control of the quality of thermoelectric properties) are frequently limited or detrimentally affected. Contact with crucibles, dies or liner materials, used for containment during processing, frequently increases the concentration of impurities in such materials. Slow cooling and unidirectional thermal gradients encountered in the above processes tend harmfully to enlarge and orient the grain structure of thermoelectric materials so made.

Conventional processes are generally limited to producing thermoelectric elements that are usually circular in cross-section. When square cross-sections or other geometries are required for close packing and thermal efficiency, increased expense and decreased yields are encountered during fabrication. Fabrication of practical semiconductor-type elements with length-to-area ratios as high as 60 in.$^{-1}$, as needed for high voltage-low power devices, has not been demonstrated with conventional processes. For such power devices, designers have been forced to use less efficient metal wire thermocouples. Also, as already pointed out above, when it is desired to provide elements consisting of well-defined segments of different thermoelectric materials, there is encountered increased electrical resistance owing to diffusion of one material into the other during compacting by hot pressing, and frequently use of a barrier layer or layers is ineffective owing to poor adherence.

An object of the invention is the provision of an improved process of fabricating thermoelectric elements. Another object is the provision of high performance thermoelements having unique shapes and sizes. Still another object is the provision of thermoelements comprising densely packed, oriented thermoelectric materials. A further object is the provision of long, thin thermoelements wherein the particles of thermoelectric materials are oriented along the length of the thermoelement and the length to area ratio is at least 60 per inch. An important object is the provision of an integral thermoelement comprising well-bonded segments of two or more thermoelectric materials having the same electrical charge. A further object is the provision of an integral thermoelement wherein two different thermoelectric materials having the same electrical charge are separated by a diffusion barrier. Still another object is the provision of an integral thermocouple unit wherein the n-type thermoelectric material is separated from the p-type thermoelectric material by an electrically and thermally insulating agent. A further object is the provision of an integral thermocouple unit comprising p-type and n-type thermoelements having hot and cold ends, a hot strap connecting the hot end of the p-type with the n-type thermoelement, and electrical and thermal insulating agent between the p-type and n-type thermoelement, and radiator elements at said cold ends. Another very important object is the provision of a method which is suitable for the mass production of thermoelements, thermoelectric couples, and readily assembled units of electricity-generating devices. A most important objective is the provision of compact power-generating, heating, and cooling units that can be used in an in-pile (surrounding heat-source components of nuclear reactors and isotopes) position where effective heat transfer by radiation and convection can be attained.

These and other objects hereinafter defined are provided by the invention wherein there is provided a thermoelectric element comprising a solid, coherent thermoelectric body formed by the arc plasma-spraying of a particulated thermoelectric composition upon a substrate. The following process is employed: The thermoelectric composition is injected into a stream of plasma formed by passage of an inert gas into an electric arc, the resulting mixture is caused to escape through a nozzle to form a jet comprising the thermoelectric material suspended in the plasma, and a stream of an inert gas is directed upon the jet to deflect the plasma component of the jet from a proximate positioned substrate while allowing the thermoelectric material to impinge upon said substrate for depositing a continuous coating on the substrate. Hereinafter this method of depositing said coating will be referred to as plasma-spraying.

It is well-known in the art to coat materials with metals by either of the two different high temperature spraying processes: (1) flame-spraying and (2) arc plasma-spraying.

Although flame-spraying of metal is a valuable technique of metallizing non-metallic bases such as wood, plastic and glass, it is not generally useful for coating with very high melting, refractory materials because temperatures required for melting may not be attainable. However, even when the proper temperature is attainable, the flame spray method is generally unsuitable for use with thermoelectric compositions, generally, because the environment of the flame tends to change the composition while it is being sprayed, e.g., by oxidation. Insofar as application of a plurality of coatings is concerned, there is always the danger that chemical reaction will occur between the constituents of each coat. Also, when working with the rough, porous coating which is often obtained by flame-spraying of a powdered solid, there results penetration of the second coating into the porous one if a wire or melt be used for the second coat; or, if the second coat be applied by the powder process, the accumulation of unmelted particles at the interface of the two coatings results in poor adhesion. Moreover, for use in building up layers of thermoelectric materials, flame-spraying of powdered materials is inadequate because of lack of uniformity of the particles within the layer and the mechanical weakness of each layer caused by the porosity generally present in such layers.

In order to provide for a means of spraying materials which are too high melting to be worked with by the flame-spray method, the arc plasma-spray technique has been devised. Here there is used, for heating, plasma produced by an electric arc from an inert gas. Pure heat at temperatures of up to, say, 30,000° F. is thus provided. Briefly, in arc plasma-spraying, an inert gas is passed through an electric arc to form plasma, i.e., ionized gas of high temperature and velocity. Finely comminuted thermoelectric material, transported in a carrier gas stream, is injected into the plasma stream through a feed port immediately downstream from the arc, and the very high temperature converts it into the liquid state. As the jet of plasma escapes through a nozzle it carries the coating material with it in a very rapid, fine spray. The plasma jet is generally deflected by a stream of an inert gas in order to avoid direct impingement of the high temperature gas stream on the article to be coated which is generally cooled during spraying. Because the molten coating material is not affected by the deflecting gas stream because of its greater mass and momentum, the coating material travels in essentially straight lines and deposits on the article to be coated. The arc plasma-spray coating process is described, with diagrammatic portrayal, at p. 283 of volume 8 of the McGraw-Hill Encyclopedia of Science and Technology, N.Y., 1960. Apparatus for arc plasma-spraying is commercially available from a number of manufacturers, e.g., Plasmadyne Division of Giannini Scientific Corporation and Thermal Dynamics Corporation. Although the arc plasma-spray provides a means of coating with very high melting materials, the application of this technique to mixtures of thermoelectric compositions has been considered to be impracticable because of possible deterioration of the composition at the high temperatures, thereby obtaining a deposit of a material which has been altered disadvantageously with respect to thermoelectric property. Also, since it has been feared that alloys containing low-melting-point elements could not be used lest they be burned out, it was likewise feared that some constituent of a thermoelectric mixture might be destroyed.

We have found that arc plasma-spraying is admirably suited for the coating of a refractory substrate with thermoelectric materials. Although we do not know why thermoelectric properties of the applied materials do not deteriorate during the coating process, it may be that the very high velocities developed in the plasma jet gun minimize exposure of the thermoelectric materials to the high temperature stream and prevent any reaction from occurring. Also, if a reaction does occur, any disadvantages resulting therefrom may be more than offset by advantages gained in obtaining a uniform structure of a density which is substantially theoretical. An anisotropic structure is present in the sprayed materials; this is unattainable by ordinary hot-pressing techniques. Accordingly, the arc plasma-spraying technique contributes to increased efficiency of the thermoelement in that control of resistivity and conductivity is obtained by orientation in the microstructure.

For the building up of the layers of diverse thermoelectrics which comprise a segmented thermoelement, the arc plasma-spray process is uniquely suited because the coatings are just porous enough to provide for tenacious bonding but not so coarse that interpenetration of a first coat by the second coat is permitted. Each coating is a discrete layer. In contrast with prior beliefs, no reaction between any constituent of one layer with that of another appears to result from spraying of adjacent layers; or, if any reaction does result it is not one which either increases the electrical resistance along the length of the thermoelement or detrimentally modifies its thermoelectric properties.

The presently provided process makes possible the mass production of thermoelectric legs by slicing thin sections of large bodies, either flat or cylindrical, comprising substrate having one or more layers of thermoelectric materilas which have been deposited on the substrate by arc plasma-spraying. For example, for the production of disc-shaped legs a very long, coated cylinder can be sliced with a diamond slicing wheel into numerous legs of uniform size and efficiency. Also square or rectangular thermoelectric legs can be produced by cutting flat substrate upon which the thermoelectric material has been arc plasma-sprayed. The substrate may or may not be employed as the hot junction of the leg. Thus, legs of thermoelectric couples are readily produced by slicing the coated substrate. The coating is the thermoelement and the substrate can serve as either the hot junction or the heat-radiating cold end. Spraying on graphite thus gives a built-in, integral hot junction of graphite. If desired, when the substrate is graphite or another material which can be heat-decomposed at temperatures below the decomposition point of the thermoelectric material, a shaped body of only the thermoelectric can be obtained by heating the coated piece to volatilize and remove the substrate. This procedure is particularly advantageous for the production of long, thin legs. For example, the strip shown in FIGURE 6 of the drawings and comprising the graphite substrate G and thermoelectric layer T can be heat-treated, say, at a temperature of from about 500° C. to 800° C., to leave as residue only the long, thin portion T of the strip. In a thermoelectric device, heat is applied at one end of the long, thin member, traveling from H to C. Square or rectangular legs may be similarly produced, since spraying of the thermoelectric can be conducted to give a layer of any desired thickness and because the sprayed thermoelectric is a dense, compact solid which can be readily cut without fracture. The substrate may or may not serve as one of the junctions. A convenient means of fabricating an integral unit comprising a thermoelectric material with hot and cold junctions comprises are plasma-spraying of a thermoelectric material upon, say, a graphite substrate to give an inner layer of the thermoelectric and then depositing, by any technique, a coating of an electrically conductive material as an outer layer, e.g., an elemental metal, a metal alloy or an inorganic metal compound. Although the coating of electrically conductive material may serve only as an electrical lead, if it possesses good heat-dissipating properties it can serve also to increase the over-all temperature difference ($\Delta t$). Generally, such processes as deposition from volatilized metal, dipping in metal, etc., result in only thin films of little heat-dissipating value and poor adhering property. Flame- or plasma-spraying of a metal, e.g., molybdenum, tungsten, copper, or aluminum, gives a tenacious layer which not only provides for electrical conductivity and dissipation of heat, but also adds to the mechanical strength of the thermoelement. It also provides for rugged attachment of wire leads, radiators or liquid cooling means. The graphite substrate serves as the hot junction.

The thermoelectric material which is arc plasma-sprayed may be any finely comminuted solid having thermoelectric properites, of either the p-type or n-type form, and stable at a temperature of at least about 200° C. Generally, it is prepared by crushing, grinding and/or milling a solid body comprising a matrix of a semiconducting material together with significant quantities, say, in the order of from about $1\times10^{-13}$ to 15 percent by weight of an additive which will determine the positive or negative characteristics of the element. Such additives, e.g., boron, arsenic, iodides, etc. are commonly referred to as p- or n-type dopants. Numerous examples of p- or n-type thermoelectric materials are disclosed, for instance, in the C. M. Henderson et al., U.S. Patent Nos. 3,081,361–5, 3,087,002 and 3,127,286–7, the Fritts U.S. Patent Nos. 2,811,571 and 2,896,005, the Cornish Patent Nos. 2,977,400 and 3,110,629, the Heikes U.S. Patent No. 2,921,973, etc. There may also be present in the thermoelectric composition small amounts of dispersants adapted to improve the strength and/or thermal properties of the composition, for example, the phosphides, borides, silicides, oxides, carbides or sulfides of boron, thorium, aluminum, etc., as disclosed in the Henderson Patent Nos. 3,256,697–3,256,702. The nature of the matrix will depend upon the temperature at which it is desired to operate the thermoelectric device. The thermoelectric material should be one which not only possesses a satisfactory figure of merit under the contemplated conditions but also one which is unaffected either electrically or mechanically by the temperature to which it will be subjected to use in the device. Materials exist that operate most advantageously at various temperature ranges within the broad range of, say, from about 100° C. to 1200° C. For operation at a temperature range of from about 100 C. to 300° C., very widely used materials are combinations of bismuth and/or antimony and/or lead with tellurium or selenium. For higher temperatures, say, temperatures of up to about 950° C. to 1000° C., various combinations or alloys of silicon and germanium or materials such as the antimonides, phosphides and/or arsenides of indium may be used. Employing proper dopants, e.g., sodium or boron as p-type dopant or cobalt, arsenic or lead iodide as n-type dopant, the same type of matrix can be used to form a thermoelectric material of either positive or negative electrical charge; see, e.g., the book by William Shockley "Electrons and Holes in Semiconductors," N.Y., D. Van Nostrand Co., 1950, particularly pp. 4–15. Commercial suppliers of thermoelectric materials frequently incorporate the dopant into the matrix and simply characterize the products as either of the p-type or the n-type, without identifying the dopant. Thus, lead telluride is applied commercially as p-type lead telluride when it contains a p-type dopant such as sodium and as an n-type lead telluride when it contains an n-type dopant such as lead iodide. Also, very often, when certain elements are mixed together, they form molecular compounds. When a constituent is present in excess over that required for a molecular compound with another constituent of the mixture, the excess may serve as dopant.

Examples of some thermoelectric compositions which are useful in the fabrication of p-type elements for operation at high temperatures, i.e., at temperatures of over about 1000° C. are the boron-based materials disclosed in the Courtland M. Henderson et al., U.S. Patent Nos. 3,087,002 and 3,127,286–7, e.g., combinations of boron with one or more of the elements: carbon, silicon, aluminum, beryllium, magnesium, germanium, tin, phosphorus, titanium, zirconium, hafnium, cobalt, manganese and the rare earths of type 4*f*, carbon is preferred. The boron-based thermo-electric are characterized by an unusually high stability of the Seebeck coefficient at elevated temperatures and are thus useful as thermoelectric power generating substances at temperatures far above those at which conventional semiconductors may be employed. Boronated graphite, such as that disclosed, for example, in the R. D. Westbrook et al., U.S. Patent No. 2,946,835, or platinum-rhodium alloy or silicon carbide are other examples of thermoelectric materials which are useful for obtaining electricity from heat sources well above, say 1000° C. Thermoelements made of silicon and carbon which may or may not be in stoichiometric proportions required for silicon carbide are generally suitable as n-type elements for high temperature operation.

The properties of numerous thermoelectric compositions and their optimization are well summarized in the books by A. F. Ioffe, Semiconductor Thermoelements and Thermoelectric Cooling, London, Infosearch Ltd., 1957, and by R. W. Ure and R. R. Heikes, Thermoelectricity: Science and Engineering, Interscience Publishers, N.Y., 1961.

The present invention is particularly suited to the production of thermoelements comprising two or more segments or layers of different thermoelectric materials. With a layer or layers of extremely heat-resistant materials there may be used, in a segmented thermoelement, one or more layers of thermoelectrics which are ineffective at extremely high temperatures but which do serve to produce electricity at lower temperatures. The thermal gradient across the entire segmented thermoelement assembly can be optimized by judicious choice of thermoelectric material for segments thereof. Thus on the surface of a layer of the boron-based material may be arc-plasma sprayed a layer of a less heat-resistant semi-conductor such as an indium phosphide or arsenide, a lead- or bismuth-tellurium or a silicon-germanium alloy, etc. The thermoelement may consist of any number of layers, i.e., segments, of diverse thermoelectric materials positioned to operate at optimum temperatures between the hot and cold sides of the thermoelement. When segmented thermoelements are produced by conventional hot pressing techniques, some of the thermoelectric material of one segment diffuses into an adjacent segment; or materials from adjacent segments react with each other during the pressing to form at the interface of the segments a material of greater electrical resistivity and/or poor bond strength and/or poorer thermoelectric properties. Using the arc plasma-spraying technique, we have surprisingly found that such diffusion is either minimal or inconsequential. When operating according to the present process, electrical conductivity and thermoelectric properties of the thermoelectric materials are not substantially affected and bonds of great mechanical strength and resistance to thermal shock are achieved. Thus, in a series of experiments wherein a powdered, boron-based thermoelectric material was hot pressed directly to metals such as chromium, titanium or hafnium, only low-strength bonds were produced; and while good bonding was obtained with tantalum or columbium, the thermoelements thus produced exhibited poor thermal expansion properties even at very low heating rates, say, at rates as low as 50° C./minute. In many instances, segmented elements, formed by compacting at high temperatures and pressure, fracture from thermal shock during cooling. Such difficulties are not encountered when the segments are formed according to the present process.

Thermoelements having any number of segments with or without intermediately positioned barrier layers are readily manufactured by the present process. The number of segments will be determined by the thermoelectric properties of each segment as well as by dimensions which are permitted for use in the contemplated device. Whether or not a barrier layer or layers are employed also depends upon the nature of the thermoelectric material. If it is one which is known to diffuse during operation in a thermoelectric device, then a barrier layer is recommended. However, if it is known that the thermoelectric material is stable at 1000° C. or above and that diffusion and chemical inter-reaction between constituents of each segment is the result of prior art molding and/or bonding technique used in fabricating the thermoelement, then a barrier layer is unessential. This is because by arc plasma-spraying, interpenetration of one layer by constituents of an adjacent layer does not occur to the degree which occurs in hot-compression molding techniques. Also, reaction between the constituents of adjacent layers, with resulting formation of possibly electricity resisting products at the interface of the layers is minimized if not entirely suppressed when the layers of thermoelectric materials are formed by arc plasma-spraying rather than by hot-compression molding.

For a better understanding of the invention, the procedure used for preparing a sprayed segmented thermoelement is described below. Of course, when only one thermoelectric material is used, the same arc plasma-spraying technique is employed as that used for a segmented thermoelement.

In FIGURE 1 of the drawings, there is shown a cross section of one form of multi-layered thermoelements produced according to this invention, and having a graphite or refractory metal hot junction and a metallic cold-end material. It is made as follows: Substrate 1, which may be a tube of graphite or of another suitable refractory substance, to serve as the hot end, is preheated by exposure to a continuous high-temperature plasma jet stream, produced by passing a gas through a high-energy DC arc in a conventional arc plasma generator. Finely comminuted material suitable for use as the essential component of a high temperature thermoelement is then transported in a carrier-gas stream and injected into the plasma jet e.g., near the exit nozzle of the gun for rapid melting and deposition onto the heated substrate. During the spraying operation, a cover gas may be applied to the substrate to control its temperature and to remove any rust, dirt and unmelted particles which could affect coating properties. An auxiliary gas may also be used to deflect the plasma stream, without significantly affecting the molten powder spray pattern, thus avoiding direct impingement of the plasma jet on the substrate which could result in overheating and failure of the coating and/or the substrate.

Operating conditions are controlled in known manner to maintain adequate melting of the thermoelectric material being fed into the plasma jet, and sufficient spray time is utilized to produce the layer 2, consisting of the deposited thermoelectric material, in any desired thickness. Thermoelectric layer 3 is then spray-bonded onto the layer 2 by a similar technique employing a suitable material, e.g., a thermoelectric having a different temperature vs. figure-of-merit characteristic. The optimum operating temperature for layer 3 is generally considerably lower than that for layer 2, wherein the temperature gradient is from layer 2 (hottest) to layer 4 (coldest). During spray fabrication, operating conditions are adjusted to achieve satisfactory melting and deposition and to give layer 3 of the desired thickness. Another coating layer 4, is similarly applied, using a different thermoelectric material. Additional thermoelectric materials can be applied to give a composite of any number of layers, although FIGURE 1 shows only three layers of the thermoelectric material. Since a thermal gradient over the thermoelement is the prime objective, thermoelectric materials should be so selected and positioned so as to be exposed, during operation of a thermoelectric device, to those temperatures which will yield optimum performance.

After the desired number of adjacent layers of thermoelectric materials have been spray-bonded to the graphite or refractory metal substrate, a layer (in case of FIGURE 1, it is layer 5) of appropriately thick (to minimize $I^2R$ losses) electrically conducting material is applied over the final thermoelectric layer to serve as cold-end electrical conductor. This cold-end conductor may be applied by arc plasma or flame-spraying of an appropriate powdered material or by metallizing with an oxygen-acetylene torch employing a suitable metallic wire.

Th arc plasma spraying may be conducted to give a layer of thermoelectric of any desired thickness depending upon spraying time. A coating thickness, say, from about 5 to 500 mils is generally useful, depending upon the nature of thermoelectric and the area on which it is deposited. The spraying may be conducted in air or under non-oxidizing conditions, depending upon the susceptibility of the thermoelectric material to oxygen at high temperatures. The gas used for providing the plasma may be inert, e.g., argon, helium or xenon, or chemically active, e.g., hydrogen or nitrogen, or a mixture of inert and chemically active gases, e.g., 95% (vol.) argon-5% (vol.) hydrogen. Mixtures of inert and chemically active arc gases provided improved melting of sprayed particles with much less severe operating conditions than the corresponding completely inert gas. Chemically active arc gases can affect the polarity of the sprayed material to some extent by dissolving atomic species, e.g., nitrogen atoms, in the lattice structure of the sprayed thermoelectric. The gas may or may not be preheated before it is fed to the arc. Advantageously, the finely comminuted, solid thermoelectric is introduced into the plasma by means of a carrier gas which may or may not be of the same composition as the plasma-producing gas. Powder feed rate can be adjusted to achieve satisfactory melting and deposit efficiency. The power level of the arc plasma generator can be varied in most commercial instruments; generally, from 5 to 80 kilowatt (preferably 5 to 40 kilowatt) arc plasma-spray guns give good results. Plasma stream enthalpy may be varied over a wide range depending upon the arc gas type and the composition being sprayed. Generally, the substrate will be positioned at a distance of only a few inches, e.g., 0.5 to 5 inches (preferably from 1.0 to 3.0 inches), from the nozzle, and is advantageously supported on a mandrel or other rotating device when a tubular substrate is used. Deflection of the plasma stream before it impinges upon the substrate is often advantageous to minimize overheating when the substrate is positioned close to the nozzle. Such deflection may be by means of a nitrogen stream. Cooling of the substrate, when believed to be desirable owing to proximity of the nozzle, may also be effected by nitrogen. Use of a water-cooled, controlled environment chamber permits greater latitude with respect to positioning, spray deflection and cooling, of course.

In prior art, it has been customary, in fabrication, to depend upon the hot compression, extrusion or molten casting steps for arriving at a composition having optimum thermoelectric properties. For example, a molecular compound or an alloy would be produced by charging to a die a mixture of elements in proportions suitable for the desired compound or alloy; the latter was then formed during the hot compression. For use in arc plasma spraying the thermoelectric material should be prepared before injecting into the plasma; i.e., unlike the conditions encountered in hot compression, those encountered in the plasma jet do not facilitate the change of a mixture of diverse components of no thermoelectric property into a material which does possess such property. In spite of extreme temperature conditions, contact time is apparently too short for substantial change to occur. Although the normally solid feed should be finely comminuted before it enters the plasma stream, this is done primarily to facilitate rapid melting of the feed and to assure a homogenous deposit, rather than to facilitate any chemical change of the material which is to be sprayed.

Although the arc plasma-spray technique permits manufacture of thermoelements of any desired configuration, the present invention is particularly valuable in that it provides for mass production of thin, square or rectangular thermoelements that can be closely packed. This is done by slicing the sprayed material. Heat losses and high fabrication costs which are characteristic of conventional thermoelectric generator designs employing radially mounted, rod-shaped thermoelements are significantly reduced by using the thin components. High length/area ratio of the elements, of vital importance in arriving at thermoelements having maximum efficiency, can be readily controlled. Appropriate length/area ratios required for optimum performance of thermoelements can be obtained by appropriate cutting and slicing of sections of the sprayed deposits such as shown in FIGURES 1, 5, 6 or 7.

Figure 6:
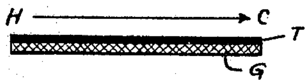

A very convenient means of forming long, thin rods comprises spraying a flat plate of graphite with the thermoelectric and then slicing the product into thin strips, for example, such as those shown in cross-section in FIGURE 6 of the drawings, wherein thermoelectric layer T has been deposited by arc plasma spraying on the graphite substrate G. The graphite substrate can be readily burned off to give a long, thin rod of only the thermoelectric. The thickness of the strip multiplied by the width of the layer thus define the base of the rod. Denoting one dimension of the base as $x$ and the other as $y$, and the length of the rod (from H to C in FIGURE 6) as $l$, then the length/area ratio can be expressed as $l/xy$. Thus, by slicing an 0.25″ thick strip from a 2″ x 2″ graphite plate which has been sprayed with an 0.1″ thick layer of thermoelectric there is obtained a rod having a base of 0.25″ x 0.1″ and a length of 2″. The length/area ratio of such a rod is thus 2/0.025 or 80 inch$^{-1}$. The obtaining of so high a value with prior art thermoelements is problematic, because compacting by hot pressing is not amenable to the production of mechanically strong, long, thin elements and semi-conducting materials are generally of ceramic rather than metallic nature so that they cannot be drawn. Compacting under heat and pressure of most thermoelectric materials to obtain coherent, solid units generally is limited to the production of units having a circular rather than a rectangular base. Also, objects having a diameter of as little as 0.25″ and a length of 2″, if obtainable by hot-pressing, have poor integrity because uniformity in fusion and subsequent compacting cannot be achieved. Hence, they crumble easily and do not possess constant electrical and thermal properties. However, the length-to-area ratio of a 2″ long rod having a diameter of 0.25″ is only about 2/.05 or 40 inch$^{-1}$.

The present invention is also valuable in that it permits the production of thin, easily stacked annular elements comprising one or more thermoelectric materials. When such elements are produced by arc plasma-spraying the thermoelectric composition upon the outer surface of a refractory tube, say, one of graphite, and the tube is sliced diameter-wise to give thin rings, the inner, hollow portion serves conveniently as heat housing with the graphite substrate being a heat-conducting member at the hot end of a thermoelectric leg. For example, the outer surface of a thermally stable, refractory tube, e.g., of graphite of any length, is arc plasma-sprayed to give a radially-extending layer of thermoelectric material or a plurality of radially extending layers of diverse materials in the case of a segmented element. Finally, if desired, a coating of an electricity conducting metal is applied. At any stage of the fabrication the tube may then be cut to give a number of essentially identical thermoelements of any desired geometry. One such thermoelement, comprising segments or layers of three different thermoelectric materials is shown in cross section in FIGURE 1. In the conventional segmented rod-shaped element, the length of the thermoelement is equal to the sum of the depths of each segment. So it is in the annular element of FIGURE 1 the sum of the thicknesses of members 2, 3 and 4 being equal to the length of the thermoelement. The length of the thermoelement when in annular form is thus the sum of the depths of each layer of thermoelectric material. In the annular element, the area corresponds to the average circumferential thermoelectric coating area of each thermoelectric segment through which thermal energy flows.

Depending upon the nature of the thermoelectric material, the annular thermoelement may be either of the n-type or of the p-type. To form a thermocouple, a p-type thermoelement may be fixed concentrically upon an uncoated ring of the same or other heat-conducting material as that of the tubular substrate and of about the same diameter, and an n-type thermoelement can be fixed, also concentrically, upon the uncoated ring. The uncoated ring thus serves to connect the hot ends of the p- and n-type thermoelements electrically in series. Electrical leads, fixed to the outer layer of each element, i.e., the cold ends, deliver electrical powr to the load as heat is applied to the substrate. A plurality of such thermocouples may be used in series or parallel arrangement to form a thermopile, each couple being separated by a material which serves as thermal and electrical insulator.

In the segmented thermoelements, the layers of thermoelectric materials may or may not be separated from each other by a diffusion resistant barrier layer. The outer layer of thermoelectric material may be coated with an electricity conducting material to form an electrical lead when the outer layer forms the cold end of the thermoelement. In this case the substrate to which the first layer of thermoelectric material is applied is advantageously an electrically and thermally conducting material. Examples of materials for use as substrate for preparing either the segmented or non-segmented type are commercial graphite, pyrolytic graphite, tungsten, molybdenum, tantalum, titanium, iron, copper, beryllium, etc.

The present invention is also particularly suited to the fabrication of thermoelements which must present a large surface area to the heat source, e.g., solar radiators. These may comprise a flat, sandwich structure or they may be of concave structure for absorption and concentration of heat at a portion which contains heavy layers of an extremely heat resistant thermoelectric.

The invention is further illustrated by, but not limited to, the following examples.

EXAMPLE 1

A p-type multi-layer thermoelement was produced by applying concentric layers of diverse thermoelectric materials to a graphite substrate by arc plasma-spraying technique and adding a thin layer of molybdenum over the outer surface of the low temperature thermoelectric material to serve as electrical connector at the cold end. The thermoelement thus produced is typified by the one shown in cross section in FIGURE 1 of the drawings, wherein member 1 is the substrate.

A finely comminuted p-type thermoelectric material designated as D–50–19A and prepared by heating boron with 11% by weight of carbon to give p-type thermoelectric property was crushed in jaw and roller crushers, and sifted in a conventional sieve shaker to pass a 325 Tyler mesh screen.

A graphite tube having an outside diameter of 0.5", an inside diameter of approximately 0.375", a ⅜–24 thread through the center of the tube, and a length of 0.625" was outgassed by heating at 900° C. in a vacuum of $10^{-5}$ mm. Hg for 1 hour. After cooling to room temperature, the tube was placed on a rotating-traversing assembly for uniform exposure to the plasma jet stream during layer deposition.

Argon containing 5% by volume of hydrogen was introduced into the arc-gas feed port of a commercial 25-kw. arc plasma generator and was converted to plasma. The comminuted thermoelectric material D–50–19A, was placed in the powder tank which formed part of the equipment and argon was introduced to the powder tank to serve as a carrier-gas stream for transporting the powder through the feed port of the front electrode and into the plasma stream. The feed powder was thus appopriately melted and subsequently transported through the jet nozzle for deposition onto the exposed graphite tube. Arc current during spraying was 680 amperes and arc voltage was 31 volts.

The tube, heated to about 250° F. before coating with thermoelectric material, was mounted on a device which rotated it at 140 revolutions per minute while simultaneously oscillating it to expose the entire circumferential surface uniformly to the spray. During the spraying, a stream of nitrogen was directed to impinge on and envelope the tube in order to provide for cooling during deposition of the thermoelectric layer. At the same time, another stream of nitrogen was used to deflect the very hot plasma-jet and to avoid direct impingement of the high temperature stream on the tube since such action could result in cracking and spalling of the layer deposited. The stream of molten powder being sprayed was essentially unaffected by the deflecting gas owing to the relatively large mass of the powder particles. The temperature of the substrate at the end of the spraying process was about 320° F. A layer of thermoelectric material well-bonded to the graphite substrate and having an average thickness of 0.078" was produced in 10 minutes spraying time. In FIGURE 1, this is depicted as member 2.

Another thermoelectric material, designated as D–40–9P, and having an optimum operating temperature which was somewhat lower than that of D–50–19A, and consisting essentially of equal parts by weight of germanium and silicon and a very minor proportion (about one percent of the toal weight) a p-type dispersant was fragmented and sifted to pass 325 Tyler mesh. It was mixed in a 1:1 weight ratio with the above described comminuted D–50–19A and this mixture was used as the powder feed to provide a second layer of thermoelectric material. The cooled tubular substrate which had initially been coated with the layer of D–50–19A, as described above, was preheated to about 210° F. and sprayed with the 1:1 mixture of D–40–9P and D–50–19A, operating substantially as in application of the first layer, but continuing the arc-plasma spraying only until a 0.015" thick coating (FIGURE 1, member 3) was obtained. The sprayed tube was then allowed to cool to room temperature.

A third coating, member 4, FIGURE 1, was then applied. This time, the comminuted D–40–9P was used as the only powder feed. After preheating the tube with its two coatings to a temperature of about 200° F., arc plasma-spraying was continued until there was obtained a 0.062" thick layer of D–40–9P. Finally, after allowing this third coating to cool to room temperature, a very thin outer coating, member 5, FIGURE 1, of molybdenum was flame-sprayed over the third coating. A double molybdenum wire was flame-spray bonded to the outer molybdenum coating for use as current and voltage leads. For measurement of cold-junction temperature, a small-gage chromel-alumel thermocouple was also flame-spray bonded to the outer molybdenum coating. In order to facilitate dissipation of heat, four 2.75" x 0.5" x 0.014" copper fins were radially extended at spaced intervals from the assembly by flame-spray bonding to the molybdenum coating. A metallizing gun employing an oxygen-acetylene flame was used for the flame-spraying. All of the exposed molybdenum surface, as well as the copper radiator, was painted with a black emissive coating to permit achievement of the greatest temperature difference. The thermoelement was a strong, well-bonded piece which could not be readily crushed or broken by hand or upon dropping.

It was tested for efficacy by using it as one leg of a thermoelectric couple, whereby the threaded graphite center of the element was fixed to a graphite plug which served as thermal conductor from a heat source, and the radiators were exposed to the ambient. The temperature difference between the hot end and the cold end of the thermoelement was determined by means of a thermocouple positioned at each extremity. After 1 hour of operation with the hot end at approximately 1200° C., there was determined a temperature difference, ΔT° C., of 452.5° C., across the element. The internal electrical resistance was found to be 0.00675 ohm. A maximum power output of 0.1597 watt was obtained. The Seebeck coefficient, μ volts/° C., was 143.2.

During an extended test, resistance to thermal shock was studied. At the end of 28 hours, the element was allowed to cool at the rate of approximately 130° C./minute during the first 5 minutes and about 55° C./minute during the next 5 minute period, and then heating was resumed for operation of the hot end at approximately 1200° C. Cooling at the same rate was conducted at the end of 80 hours, with subsequent resumption of heating to 1200° C. At the end of 101.5 hours, abrupt heater shut down subjected the element to a thermal shock cooling rate of about 140° C./minute for the first 5 minutes and 40° C./minute for the next five minutes. No apparent physical damage to the coatings or bonding thereof could be attributed to these thermal cycling operations, and good performance continued. Thus at the end of 29 hours and at the end of 88 hours of operation, the resistance values were 0.00629 ohm and 0.00712 ohm, respectively; the maximum power was 0.1643 and 0.1417 watt, respectively; and the Seebeck coefficient was 151.8 and 152.7μ volts/° C., respectively.

A non-segmented element made by arc plasma-spraying the outer surface of a graphite tube with the same comminuted D–50–19A thermoelectric to give a 0.0707" thick coating and then coated with molybdenum and fitted with measuring instruments and radiators as above, gave, after 65 minutes of operation at the 1200° C. test temperature an internal resistance of 0.00980 ohms and a Seebeck coefficient of 108.4μ volts/° C. The thermoelectric material D–40–9P has too low a decomposition temperature to permit operation at the high temperatures which can be used with D–50–19A. Therefore, only much lower ΔT° values and consequently lower power output can be obtained with a thermoelement in which only this material is used as the thermoelectric. Use of both D–50–19A and D–40–9P is advantageously because high ΔT° values are thereby obtained, but in practice the materials D–50–19A and D–40–9P cannot be joined together by hot pressing because at the temperature required to fuse D–50–19A, there occurs decomposition of D–40–9P, and at temperatures which are below the decomposition point of D–40–9P, no adhesion occurs between the D–50–19A and D–40–9P materials.

EXAMPLE 2

This example shows fabrication of a segmented, arc plasma-sprayed n-type thermoelement. Substantially the same procedure was employed as that used in Example 1, except that the thermoelectric materials and quantities thereof were different and that an intermediate layer of molybdenum was used. Thus for preparing this n-type element, instead of using the boron-carbon material D–50–19A, there was used a material designated as E–60–15, and consisting of a well blended, finely comminuted mixture of silicon and carbon in about a 3:1 weight ratio with a minor amount (about 10% of the total E–60–15) of n-type dopant (cobalt) and thorium and calcium compounds. The thermoelectric material E–60–15 was arc plasma-sprayed on the graphite tube described in Example 1 in a quantity sufficient to give a 0.036" layer. Instead of the thermoelectric material D–40–9P of Example 1, in this example there was used a material designated as E–40–8N and consisting of substantially equal parts of germanium and silicon with about 7% by weight, based on the total E–40–8N, of a mixture of n-type dopants, e.g., arsenic and thorium compounds. In this example, the first layer of thermoelectric material, i.e., of E–60–15, was arc plasma-sprayed with a 0.002" thick coat of molybdenum, instead of with a mixture of thermoelectric materials, as in Example 1. The molybdenum coating was then arc plasma-sprayed with the E–40–8N to give a 0.030" thick layer thereof. A final coating of molybdenum was then applied and measuring instruments were bonded thereto as in Example 1. To the final coating there were bonded six radially extending 1.825" x 0.5" x 0.14" copper radiators. The final coat of molybdenum and the radiators were then painted, as in Example 1, with a black emissive paint.

Testing of this thermoelement as in Example 1, except that it was used as the n-type leg of a thermoelectric couple, gave at the end of 17.3 hours of operation an electrical resistance value of 0.00720 ohm, a ΔT° of 329° C., a Seebeck coefficient of 94μ volts/° C. and a maximum power of 0.0332 watt. At the end of 111.3 hours the respective values were 0.00724 ohm, 346.7° C., 91.8μ volts/° C., and 0.0350 watt.

EXAMPLE 3

In this example, there is described the fabrication and the evaluation of a p-n couple consisting of arc plasma-sprayed segmented thermoelements. Internally threaded graphite tubes, 0.5" OD, 0.375" ID and 0.625" long, were outgassed as in Example 1.

For the p-type thermoelement there were used the following thermoelectric materials.

P–5.—Boron, containing carbon and p-type dopants.

P–4.—About equal parts of germanium and silicon plus about 1 percent, based on the total weight of the P–4, of a mixture of boron and calcium oxide.

P–1.—A mixture consisting of about equal parts by weight of P–5 and P–4.

For the n-type thermoelement, the following thermoelectric materials were employed.

N–6.—An approximate 3:1 weight ratio mixture consisting of silicon and carbon and a minor weight of n-type dopants (approximately 10% of the total weight of the N–6).

N–4.—Equal parts by weight of germanium and silicon and about 7% by weight, based on the total N–4, of n-type dopants.

N–1.—A mixture consisting equal parts by weight of N–6 and N–4.

All of the above thermoelectric materials had been comminuted and sieved to pass 325 Tyler mesh.

Employing substantially the procedure described in Example 1, one of the graphite tubes was arc plasma-sprayed to give first a 0.078" layer of P–5, then a 0.015" layer of P–1, and then a 0.0625" layer of P–4. The other graphite tube was arc plasma-sprayed to give first a 0.094" layer of N–6, then a 0.031" layer of N–1, and then a 0.156" layer of N–4. These layers yielded overall area/length ratios of 8.24" and 5.45" for the p- and n-type thermoelements, respectively. The sprayed surfaces of both tubes were finally flame-sprayed with molybdenum, and measuring instruments were bonded to the molybdenum. Rectangular copper fins were attached radially to each thermoelement and they and the exposed molybdenum surface were coated with a black emissive paint.

Figure 2:
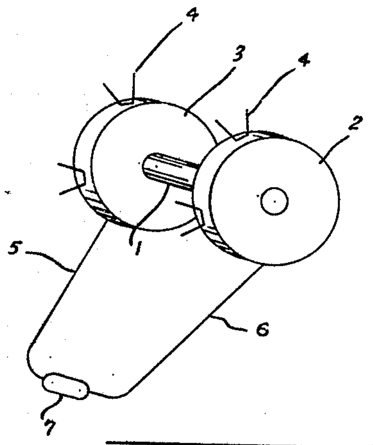

A couple was constructed from the elements by screwing one element, using the female internal threads of each element, to one end of an externally threaded, 0.375" O.D. graphite rod and similarly screwing the other element to the other end of the rod, as shown in the drawings, wherein FIGURE 2 is a thermocouple consisting of rod 1 to which there are screwed the presently provided thermoelements 2 and 3 having radiators 4 and provided with electrical leads 5 and 6 to load 7. Rod 1 is partially hollowed to accommodate a resistance heater. At an average hot-end temperature of 1161° C. and an average cold-end temperature of 815° C., the output of this couple remained at 0.1225 watt for an operating time of 819 hours in a vacuum of $10^{-5}$ to $10^{-6}$ torr. Subsequently, the couple was tested for thermal shock, whereby during a period of several days at the rate of 24 cycles per day there were reached cooling rates of 240–250° C./minute in each cycle for a temperature drop per cycle of 200° C. These tests showed no significant detrimental effect on the over-all performance of the couple, and microstructures (100×) of a slice taken from each thermoelement after sustained performance testing showed no change in the microstructure of the three different layers which had been tested.

EXAMPLE 4

Figure 3:
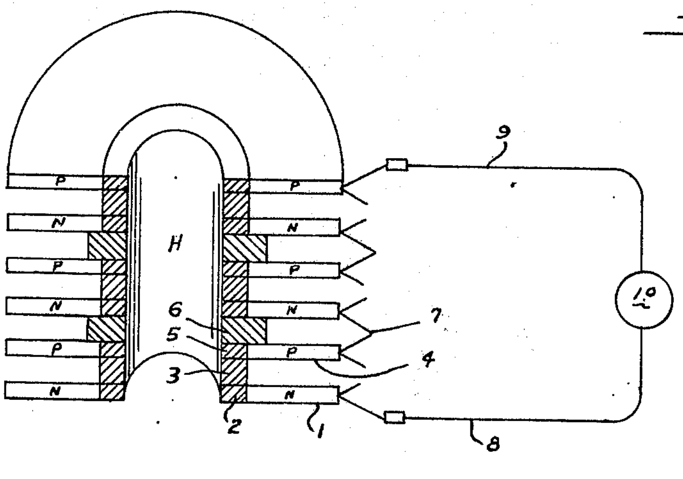

Thermoelements were made by arc plasma-spraying of diverse thermoelectric materials, as described in Examples 1 and 2. The thermoelements were then used to make the thermopile which is shown in FIGURE 3, wherein member 1 is the segmented n-type thermoelement of Example 2 which was made by arc plasma-spraying the outer area of an annular thermally and electrically conducting refractory substrate 2 with layers of diverse thermoelectric n-type materials and finally flame-spraying with an electricity conducting metal; member 3 is an annular thermally and electrically conducting element which may be of the same material as substrate 2 and which is fixed concentrically upon thermoelement 1, at substrate 2; member 4 is the p-type segmented thermoelement of Example 1 fixed concentrically through its thermally and electrically conducting substrate 5 to conducting element 3; member 6 is an annular thermal and electrical insulator of, say, an inorganic oxide, e.g., silica or thoria, and which is fixed concentrically to the p-type thermoelement 4 at substrate 5; and member 7 is a strip of copper or of other electricity conducting metal which serves as an electrical conductor and also as a radiator for facilitating transfer of heat from the thermoelement to the ambient. Member 7 is fixed to the elements by flame-spraying with molybdenum. The surface of the radiator member 7 which faces the ambient is painted with an emissive coating, as is the final molybdenum coating of each thermoelement. The thermopile construction, as shown in FIGURE 3, requires alternating separation of an n-element from a p-element by either the thermal and electrical insulator 6 or by the electrically and thermally conducting material 3. The spaces between each thermoelement may or may not be filled with a thermal and electrical insulator which may or may not be of the same composition as insulator 6. When the pile of 3 couples shown in FIGURE 3 is heated by application of heat to channel H, electrical energy is delivered through electrical leads 8 and 9 to the load 10.

Although FIGURE 3 shows only 3 couples, any number of thermocouples may be similarly stacked, using thermal and electrical insulators 6 between each couple and a thermally and electrically conducting member 3 between the substrate portion of each leg of a couple. Each couple may consist of a p-type and an n-type thermoelement having any number of segments of diverse thermoelectric materials.

EXAMPLE 5

Figure 4:
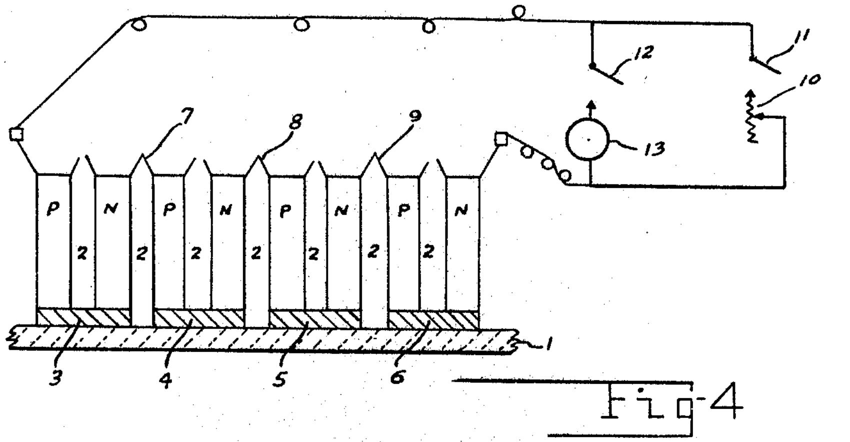

In another embodiment of the invention, the p-type and n-type thermoelements of Example 3 are assembled to give either a power generator or a cooling device, as shown in FIGURE 4. Element 1 represents an electrically insulating but thermally conducting hot wall of a nuclear or chemical reactor, exhaust manifold, pipe or other unit which it is desirable to cool or from which heat can be absorbed for the purpose of converting to electricity. Element 2 represents an air or vacuum gap or electrically and thermally insulating material between each p-n thermoelement or leg. Elements 3, 4, 5 and 6 represent individual hot-junction straps between each p-n combination. Elements 7, 8, and 9 represent individual cold junctions between each n-p combination. Said junctions comprise a strap or sheet of electrically and thermally conducting material, e.g., graphite or molybdenum at the hot ends, and copper or beryllium at the cold ends. These straps are fixed to each of the two members of the p-n combination by flame-spraying with molybdenum. The cold junctions are outwardly finned between each of the n-p combinations. That surface of the cold junction strap or sheet which is presented to the ambient may have painted on it an emissive coating of, say, iron oxide or a graphite base paint.

Elements 7, 8 and 9 serve both as electrical conductors and as radiators, heat being removed from said elements by radiation cooling. When the unit is to serve as energy converter, load 10 is connected through switch 11 with switch 12 open. To generate electricity, a heat source is directed at element 1, through which the heat flows to the individual hot junctions 3, 4, 5 and 6, then through each p and n leg and thence through cold junctions 7, 8 and 9. Thermal energy is converted to electrical energy when the thermal energy flows through the p and n legs of the device. This electrical energy can then be used to operate load 10.

When the unit is to be used as a cooling device, switch 11 is opened and switch 12 is closed, connecting the unit in series with a power source 13 which causes current to flow in a reverse direction to that of the flow when the unit produces electric power. By reversing the direction of current as used for cooling. The unit will supply heat at the previously cool part of the device and cooling at the previously hot end of the device. Thus, the device can be used for heating or cooling, depending on the direction of current flow from power source 13.

Thermoelectric devices of the type shown in FIGURE 4 are particularly useful for generating power when such a device is installed as a part of the exhaust system of autos, planes, boats, rockets and other systems where waste heat in excess of, say, 400° C. is available.

EXAMPLE 6

Cylindrical, solid, out-gassed graphite rods having a diameter of 0.12″ were arc plasma-sprayed in an air environment with either p- or n-type silicon/germanium thermoelectric material which had been ground to a −325 standard mesh powder. A rotating-traversing assembly was used to expose the cylindrical substrates uniformly to the plasma jet stream during the spraying. After briefly heating the substrate, the powdered thermoelectric material was transported from the powder tank in a helium gas stream into the plasma jet produced by employing an argon arc gas flow of 112 standard cubic feet per hour (s.c.f.h.). During the spraying, a stream of nitrogen was directed to impinge on and envelope the substrate providing cooling of the sprayed layer. Another stream of nitrogen was used to deflect the plasma jet partially and to avoid direct impingement of the high temperature stream on the substrate surface in order to minimize the possibility of cracking and spalling of the deposited layer. A torch power of 18.7 kw. and a spraying time of 5 minutes were used for spraying the n-type material and 19.5 kw. and 8 minutes for spraying the p-type material. The exterior surfaces of the rods were then mechanically ground to obtain a uniform coating thickness on each rod. After grinding, the rod which had been sprayed with the n-type material was cut on each with a diamond slicing wheel to form a cylinder having a length of 0.777″ and a coating thickness of 0.057″; whereas, that which had been coated with the p-type material was cut to form a cylinder having a length of 0.804″ and a coating thickness of 0.079″. The area/length ratio for the n-type rod was thus 0.041 inch and that for the p-type rod was 0.061 inch. The graphite core of the finished rods was then removed by exposing the specimens individually for two hours at 750° C. in air. Using an axial heat flow pattern, the Seebeck Coefficient ($\alpha$) and the electrical resistivity ($\rho$) were measured for each of the two elements thus produced. An external exciting voltage was used in determining resistance, and a rapid method, utilizing a small temperature gradient across the length of the sample, was used for measuring Seebeck Coefficient. The following results were obtained;

| Element | T, °C. | α, μv./° C. | T, ° C. | ρ, milliohm-cm. | $\alpha^2/\rho$, volts²×10⁻⁶ ohm-cm. ° C.² |
|---|---|---|---|---|---|
| p-Type | 450 | 350 | 435 | 9.2 | 13.3 |
| | 604 | 340 | 605 | 10.2 | 11.5 |
| | 802 | 430 | 812 | 10.1 | 17.9 |
| | 893 | 320 | 901 | 9.2 | 11.1 |
| n-Type | 457 | −310 | 435 | 7.0 | 13.7 |
| | 630 | −360 | 622 | 7.8 | 16.5 |
| | 860 | −330 | 859 | 5.7 | 18.8 |
| | 940 | −330 | 933 | 4.7 | 22.9 |

EXAMPLE 7

Degassed graphite cylinders (0.625 O.D) were respectively arc plasma-sprayed with finely comminuted mixtures of sintered silicon/germanium thermoelectric material which had been doped to give either n- or p-type property. Spraying was performed in a controlled environment of nitrogen. From the cylinder which had been sprayed with p-type material there was radially cut an annular segment having a thickness of 0.632 inch which had deposited upon it a 69-mil thick coating of the p-type silicon/germanium material. Since this element was to be utilized with radial heat flow, the area/length ratio was 19.9 inches. From that which had been sprayed with the n-type material there was similarly cut an annular segment having thickness of 0.572 inch upon which was deposited a 44-mil thickness of the n-type thermoelectric and the area/length ratio was thus 29.6 inches. The two segments were used as the p- and n-legs of a thermocouple, employing the graphite interiors of the segment as the hot ends and connecting them electrically in series by means of a graphite sleeve, and using the exterior surfaces of the coatings as the cold ends. Cooling was done by passing water through copper coils which had been spray-bonded with molybdenum to said exterior surfaces. With a hot-end temperature of 812° C. at the p-leg and 1080° C. at the n-leg, there was obtained an open circuit voltage of 97.3 millivolts, a current of 2.48 amperes, and a resistance of 0.0062 ohm. Although the length/area ratios of the legs were low, owing to their disc-shaped form, the couple gave a maximum power output of 0.38 watts (*e*) or 23.8 watts (*e*)/lb. of thermoelectric material.

EXAMPLE 8

Finely comminuted (−325 mesh) heavily p-doped silicon/germanium material was sprayed in an air environment onto flat 0.5" x 1.0" graphite plates using argon as the arc gas, helium as the powder-carrier gas, nitrogen as cooling and deflecting gas, a spray distance of 1" and a torch input power of 19.3 kw. to give a greater than 0.25" thick coating of the thermoelectric material. The flat plate-like coating was then machined by surface grinding to a uniform thickness. Two rectangular blocks of thermoelectric material were sliced from the sprayed layer. One block was sliced so as to have its axis parallel to the direction of the spray used during earlier fabrication of the coating. The other block was sliced so that its axis was perpendicular to the spray direction previously employed. Solid cylindrical specimens were then formed from each rectangular block by cutting and grinding techniques. Using axial heat flow through each cylinder of thermoelectric material, the Seebeck Coefficient and the electrical resistivity were measured over a temperature range, as shown below, to observe the effect of coating layer orientation on these properties.

The above results indicate that coating anistropy can be produced by plasma spraying to provide improvements in the Seebeck coefficient and consequently in the ratio, $\alpha^2/\rho$, of thermoelectric materials.

The thermal conductivity of these cylindrical MCC 40P specimens was also measured at low temperature, after stabilization for at least 4 hours, and the results are shown below:

| Test specimen | Orientation with respect to sprayed direction | T, ° C. | k, watts/cm. ° C. |
|---|---|---|---|
| A | Perpendicular | 32.2 | .036 |
| | do | 46.8 | .051 |
| | do | 69.6 | .054 |
| B | Parallel | 73.8 | .064 |

Assuming that the thermal conductivity measured at room temperature is not significantly different from that which would be observed at higher temperatures, the following values for the Figure of Merit (Z) can be determined:

| Test specimen | Orientation with respect to sprayed direction | T., ° C. | $\alpha^2/\rho$, volts²×10⁻⁶, ohm-cm. ° C.² | $Z=\alpha^2/\rho k$, ° C.⁻¹ |
|---|---|---|---|---|
| A | Perpendicular | 585–598 | 8.8 | .00017 |
| | do | 781–802 | 9.1 | .00018 |
| | do | 871–906 | 4.8 | .00009 |
| B | Parallel | 389–416 | 14.4 | .00022 |
| | do | 587–598 | 14.3 | .00022 |
| | do | 777–794 | 15.3 | .00024 |
| | do | 873–894 | 12.0 | .00019 |

In order to complete Hall effect and electrical resistivity measurements, two rectangular plates (0.1" x 0.2" x .030") were prepared from the sprayed layer by slicing and grinding techniques. The long axis of one plate was parallel to the direction of the spray used during earlier coating fabrication. The long axis of the second plate was perpendicular to the spray direction previously employed. Using axial heat flow through either rectangular plate, Hall effect and electrical resistivity were measured at room temperature (23° C.). Carrier concentration was deduced from the Hall coefficient and Hall mobility was determined from the Hall coefficient and the electrical resistivity.

| Test specimen | A | B |
|---|---|---|
| Orientation with respect to sprayed direction. | Perpendicular | Parallel |
| Hall coefficient, R (cm.³/coulomb): | | |
| Position 1 | 0.0822 | 0.0965 |
| Position 2 | 0.0798 | 0.1065 |
| Carrier concentration, *n* (number/cm.³): | | |
| Position 1 | 7.6×10¹⁹/cm.³ | 6.5×10¹⁹/cm.³ |
| Position 2 | 7.9×10¹⁹/cm.³ | 5.9×10¹⁹/cm.³ |
| Electrical resistivity, ρ (ohm-cm.): | | |
| Position 1 | 0.0086 | 0.00583 |
| Position 2 | 0.0086 | 0.00552 |
| Hall mobility, μ (cm.²/volt sec.): | | |
| Position 1 | 9.5 | 16.6 |
| Position 2 | 9.5 | 19.2 |

| Test specimen | Orientation with respect to sprayed direction | T., ° C. | α, μ v./° C. | T., ° C. | ρ, milliohm-cm. | $\alpha^2/2\rho$, volts²×10⁻⁶ ohm-cm. ° C.² |
|---|---|---|---|---|---|---|
| A | Perpendicular | 585 | 287 | 598 | 9.31 | 8.8 |
| | do | 781 | 287 | 802 | 9.02 | 9.1 |
| | do | 871 | 207 | 906 | 8.86 | 4.8 |
| B | Parallel | 416 | 345 | 389 | 8.25 | 14.4 |
| | do | 587 | 364 | 598 | 9.28 | 14.3 |
| | do | 777 | 381 | 794 | 9.47 | 15.3 |
| | do | 873 | 322 | 894 | 8.65 | 12.0 |

$n=1Re$ where R=Hall coefficient, $e=1.6\times10^{-19}$.

$\mu=R/\rho$ where R=Hall coefficient, $\rho$=electrical resistivity.

EXAMPLE 9

Production of thermoelements by arc plasma-spraying facilitates provision of elements of diverse geometries and hence of various area/length ratios.

Figure 5:
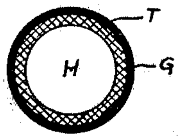

Graphite cylinders sprayed as in Example 7 with the same n-type silicon/germanium thermoelectric material were cut perpendicular to their axis to give the thin discs of various thickness and hence of various area/length ratios similar to that depicted in FIGURE 5 of the drawings. There were thus obtained thermoelectric legs having the area/length ($\alpha/l$) ratios shown below. Evaluation of the power output per pound of thermoelectric material was conducted by employing the hot-end temperatures ($T_h$) shown below with heat flowing from the hollow center H through graphite G and thermoelectric layer T of FIGURE 5. Measuring of the electrical resistance (R) and the open circuit voltage ($E_{oc}$) gave values from which the Seebeck coefficient ($\alpha$) and the maximum watts ($e$) per pound of the thermoelectric material (TE) were calculated. The following results were obtained:

| $\alpha/l$ nches | $T_h$, ° C. | R, ohm | $E_{oc}$, mv. | $\alpha$, $\mu$ v./° C. | Max. watts ($e$)/lb. TE |
|---|---|---|---|---|---|
| 59.4 | 904 | .0080 | 2.9 | 86 | 0.13 |
| 33.2 | 906 | .0085 | 5.8 | 118 | 0.21 |
| 29.6 | 900 | .0057 | 5.7 | 117 | 0.26 |
| 8.5 | 903 | .0097 | 11.0 | 278 | 0.93 |

The above data show that at substantially the same hot-end temperatures, the maximum power output per pound of thermoelectric material of disc-shaped elements made from the same thermoelectric composition is governed by the geometry of the element. When the shape is such that a low area/length ratio is provided, maximum power per unit weight is higher than that which is obtained by employing a geometry which provides a high area/length ratio. The disc-shaped elements necessarily have a high area with respect to length, since the latter dimension is only the thickness of the coating.

EXAMPLE 10

Figure 7:
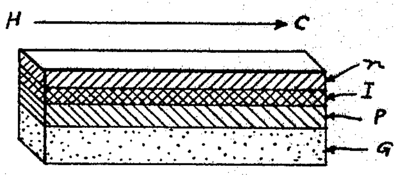

A flat graphic plate was sprayed as in Example 7 with the same p-type material to give the layer P on top of the graphite substrate G as shown in FIGURE 7 of the drawings. Coating thickness was approximately 25 mils. A 4-mil thick coating of zirconia, element I, was sprayed over the p-type thermoelectric layer to provide thermal and electrical insulation. The same n-type material (n) was plasma-sprayed over the zirconia coating to a thickness of approximately 25 mils. The sandwich of thermoelectric materials containing an intermediate zirconia layer was then sliced into the thin strips depicted in FIGURE 7 to form thermoelectric couples of small cross-section and long length. For example, a p-n couple containing a cross-sectional area of $1.11\times10^{-3}$ square inches and a length of 0.788 inch was produced by this method. The couple thus had an area/length ratio of $0.140\times10^{-2}$ inch. The graphite which served as the original substrate was then removed by burning in air at approximately 750° C. for two hours. Annealing in vacuum for two hours at 900° C. plus two hours at 1000° C. followed. Tungsten was plasma-sprayed on one end of the p-n couple to provide electrical continuity at the hot-end. Alternatively, the zirconia intermediate layer was so deposited so as to permit direct bonding of p- to n-type materials over a small area near the end of the couple.

The following results were obtained for this strip-shaped element:

| | |
|---|---|
| Area/length, inch | $.140\times10^{-2}$ |
| $T_h$, ° C. | 812 |
| $\Delta T$, ° C. | 779 |
| $\alpha$, microvolts/° C. | 228 |
| R, ohm. | 17 |
| $\rho$, ohm.-cm. | .06 |
| Max. watt/lb. TE | 4.52 |

Plasma-spraying has thus permitted fabrication of thermoelements and theremoelectric couples with area/length ratios approaching those of thermocouple wires by subsequent slicing techniques. Strip-shaped elements enable one to match the characteristics of high resistive loads without the need for intermediate power conditioning stages. This technique thus provides advantages in terms of thermoelectric efficiency and device power density. Long, narrow strips of the thermoelectric material are thus made possible by cutting the arc plasma-sprayed material to give an element wherein the length of the thermoelement can be as long as is the substrate upon which the thermoelectric material has ben deposited and in which the area can be maintained very small by using a thin coating of the thermoelectric material and slicing the coated substrate into thin slices or strips.

EXAMPLE 11

A four-couple thermoelectric generator was fabricated as follows: Internally threaded graphite tubes (1" OD, ¾" ID) were respectively arc plasma-sprayed with either n- or p-type silicon/germanium thermoelectric material in finely powdered form and the outside surface was ground to give a substantially uniform, 100-mil thick coating of the thermoelectric on the graphite. From each of the tubes there were radially sliced four 70-ml thick discs or wafers. The outer, peripheral edge of each disc was plasma-sprayed wih tungsten. One face of each disc was arc plasma-sprayed with zirconia. A thermopile was constructed wherein p-n couples were formed by placing the zirconia-sprayed face of p-type disc on top of the zirconia-sprayed n-type disc and inserting ceramic insulation between each couple. Graphite was employed as a hot-strap at the hollow center of each disc, and the couples were joined electrically in series by flame-spraying molybdenum as bridging at the outer edges of the appropriate discs. Copper radiators, comprising 1.5" long copper strips which had been bent to a "L" were spray-bonded at the flexed portion thereof to the molybdenum at the cold end of each couple, i.e., at the outer edge of the coupled discs. A graphite-containing emissive coating was applied over the radiators and any exposed molybdenum outer coating. The following performance data were obtained after five hours of operation:

| | | |
|---|---|---|
| Hot junction temperature | ° C. | 889 |
| Cold junction temperature | ° C. | 733 |
| $\Delta T$ | ° C. | 156 |
| Open circuit voltage | mv. | 232 |
| Load voltage | mv. | 36.6 |
| Resistance | ohm. | 0.105 |
| Current | amperes. | 1.9 |
| Maximum power | watt. | 0.128 |

EXAMPLE 12

Powered (−150 to +325 standard sieve) n-type or p-type silicon/germanium thermoelectric material was sprayed onto a stainless steel tube (1" OD, 0.5" ID), which had been grit-blasted and degreased with trichloroethylene. A 0.25" thick adherent coating of the thermoelectric material was obtained. This type of thermoelement was employed in a radioisotope-heated thermoelectric generator wherein heat was applied at the hollow steel core.

In the design of thermoelectric devices, particularly for use in space where generators of minimum weight must be used, it is especially important to have available not only thermoelectric units capable of operation at high temperatures, but also thermoelements having a high strength/weight ratio and capable of long-lived operation. Use of the presently provided arc plasma-sprayed thermoelements meets these requirements and permits the design and fabrication of strong, rugged thermoelectric cooling and heating devices and power generating units of any size and shape and having very good watt per pound ratios.

The arc plasma-sprayed thermoelements may be made in wafer form, particularly in the fabrication of solar cells wherein surface areas for collection of radiant energy are complemented by surface areas of emittance.

The presently provided segmented thermoelements are useful in thermoelectric apparatus generally, e.g., in power generators, cooling units, and in all devices, including thermionic units or diodes and fuel cells where a power generating assembly requires gradation in temperature. Hence, the above examples and accompanying drawings are intended by way of illustration only. It will be obvious to those skilled in the art that many variations are possible within the spirit of the invention, which is limited only by the appended claims.

What we claim is:

1. A thermopile comprising a plurality of disc-shaped thermoelements which comprise a thermoelectric body bonded to a refractory heat- and electricity-conducting material at the hot end thereof, said elements having been prepared by arc plasma spraying of a thermoelectric composition upon the outer surface of a tube of said refractory material and subsequently radially slicing the sprayed tube to provide the disc-shaped elements, said elements being concentrically and alternatingly arranged according to electrical charge to form an electrical series of thermoelectric couples, an annular heat- and electric-conducting refractory member being concentrically positioned between each thermoelement of a couple to form the hot junction, an electricity-insulating agent being concentrically positioned between each couple, and electrical conductors for connecting the couples in a series.

2. A shaped thermocouple assembly consisting essentially of two thermoelements of opposite electrical charges bonded together through an insulating material and formed by (1) arc plasma spraying a first thermoelectric composition upon a substrate to give a continuous coating of a solid, coherent thermoelectric body upon the substrate;

(2) deposition upon said coating an adherent, solid layer of a thermally and electrically insulating material;

(3) arc plasma spraying upon said layer a second thermoelectric composition having an electrical charge which is opposite that of the first thermoelectric material, to give a continuous coating of a solid, coherent thermoelectric body upon said layer of thermally and electrically insulating material; and (4) cutting the thermocouple assembly into the desired shape from the resulting unit, and fixing an electricity- and heat-conducting refractory material to an end of the assembly to connect electrically the first thermoelectric composition with said second composition.

3. The thermocouple assembly defined in claim 2, further limited in that each element thereof has a length-to-area-ratio of at least 60 per inch.

4. A thermopile comprising a substantially rectangular stack of the thermocouples of claim 2, arranged in electrical series with thermally and electrically conducting material as connectors.

References Cited

UNITED STATES PATENTS

| | | | |
|---|---|---|---|
| 2,672,492 | 3/1954 | Sukacer | 136—225 |
| 3,090,206 | 5/1963 | Anders | 136—225 X |
| 3,048,643 | 8/1962 | Winekler et al. | 136—200 |
| 3,051,767 | 8/1962 | Fredrick et al. | 136—205 X |
| 3,071,495 | 1/1963 | Hanlein | 136—204 X |
| 3,208,835 | 9/1965 | Duncan et al. | 136—201 X |
| 3,256,701 | 6/1966 | Henderson | 136—201 X |
| 3,285,018 | 11/1966 | Henderson et al. | 136—201 X |
| 3,211,586 | 10/1965 | McCoy et al. | 136—228 |

ALLEN B. CURTIS, Primary Examiner

U.S. Cl. X.R.

29—573; 136—201; 264—104